United States Patent [19]

Koide et al.

[11] Patent Number: 5,587,593
[45] Date of Patent: Dec. 24, 1996

[54] LIGHT-EMITTING SEMICONDUCTOR DEVICE USING GROUP III NITROGEN COMPOUND

[75] Inventors: Norikatsu Koide; Shiro Yamazaki; Junichi Umezaki; Shinya Asami, all of Aichi-ken, Japan

[73] Assignees: Toyoda Gosei Co., Ltd., Aichi-ken; Research Development Corporation of Japan, Saitama-ken, both of Japan

[21] Appl. No.: 423,938

[22] Filed: Apr. 19, 1995

[30] Foreign Application Priority Data

Apr. 20, 1994 [JP] Japan .................................. 6-106059

[51] Int. Cl.$^6$ ................................................. H01L 33/00
[52] U.S. Cl. ........................... 257/94; 257/96; 257/97; 257/103; 257/627; 257/628
[58] Field of Search ........................ 257/103, 102, 257/94, 96, 97, 627, 628

[56] References Cited

U.S. PATENT DOCUMENTS

| | | | |
|---|---|---|---|
| 3,969,753 | 7/1976 | Thorsen, Jr. et al. | 357/60 |
| 4,404,265 | 9/1983 | Manasevit | 428/689 |
| 4,908,074 | 3/1990 | Hosoi et al. | 148/33.2 |
| 5,006,908 | 4/1991 | Matsuoka et al. | 257/103 X |
| 5,237,182 | 8/1993 | Kitagawa et al. | 257/103 X |
| 5,281,830 | 1/1994 | Kotaki et al. | 257/621 X |

FOREIGN PATENT DOCUMENTS

| | | | |
|---|---|---|---|
| 4313798 | 11/1993 | Germany | 257/103 |
| 4323880 | 11/1992 | Japan | 257/103 |

OTHER PUBLICATIONS

Shintani et al., "X-Ray Diffraction Topography And Crystal Characterization of GaN Epitaxial Layers For Light-Emitting Diodes", J. Electrochem. Soc.: Solid-State Science and Technology, Dec. 1978, pp. 2076–2078.

Fitzl et al., "Epitaxial Growth Of GaN On {1012} Oriented Sapphire In GaCl/NH$_3$ /He and GaCl/NH$_3$/H$_2$ Systems", Crystal Research and Technology, Feb. 1980, vol. 15, No. 10, pp. 1143–1149.

*Primary Examiner*—William Mintel
*Attorney, Agent, or Firm*—Cushman Darby & Cushman; IP Group of Pillsburgy Madison & Sutro LLP

[57] ABSTRACT

A light-emitting semiconductor device includes a sapphire substrate whose main surface orientation is tilted by 1 to 4 degrees from its axis "a" $<11\bar{2}0>$, and layers epitaxially formed thereon. Tilting the surface orientation of the sapphire substrate enables uniform doping of a p-type impurity into the layers epitaxially grown thereon. As a result, the luminous intensity of the light-emitting semiconductor device is improved.

1 Claim, 6 Drawing Sheets

JUST EL
(20mA)

2° OFF EL
(20mA)

LIGHT-EMITTING SEMICONDUCTOR DEVICE USING GROUP III NITROGEN COMPOUND

BACKGROUND OF THE INVENTION

1. Field of the Invention

The present invention relates to a light-emitting semiconductor device that emits blue light and uses a group III nitrogen compound. Especially, the invention is about a light-emitting semiconductor device that emits purer blue color.

2. Description of the Prior Art

A gallium nitride (GaN) compound semiconductor with a p-n junction has been used to obtain a light-emitting diode (LED) which emits blue light. This semiconductor device is useful because of its high luminous efficiency resulting from direct electron transition and because of its ability to emit blue light, which is one of the three primary colors.

The "a" and "c" planes of semiconductors, rotate at an off angle, or just substrates, have been utilized as epitaxial growth plane of to form GaN compound semiconductor with smoother surface.

However, the luminous condition of a p-layer which is regarded as an emission layer of an LED grown on the just substrate is a group of luminous dots. This is attributed to non-uniform impurity doping of magnesium (Mg) into the emission layer. Consequently, an LED with the just substrate has poor luminous intensity.

SUMMARY OF THE INVENTION

It is therefore an object of the present invention to solve the above problem by providing an off substrate which tilts the main surface of the sapphire substrate from the plane "a" by a predetermined degree. Namely, a semiconductor is provided with the off substrate so as to dope an impurity uniformly into layers epitaxially grown thereon and improve the luminous intensity of an LED.

More specifically, in accordance with the first aspect of the invention, there is provided a light-emitting semiconductor device comprising:

a sapphire substrate;

an n-layer with n-type conduction of group III nitride compound semiconductor satisfying the formula $Al_xGa_yIn_{1-x-y}N$, inclusive of x=0, y=0 and x=y=0, a Mg-doped p-layer with p-type conduction of a group III nitride compound semiconductor satisfying the formula $Al_xGa_yIn_{1-x-y}N$, inclusive of x=0, y=0 and x=y=0, wherein the plane orientation of the sapphire substrate is set at an off angle in the range of 1 to 4 degrees from the axis "a" <11$\bar{2}$0> of the sapphire substrate.

As a result, the luminous condition of the above light-emitting semiconductor device has a planar emission, resulting in improved luminous intensity. This is attributed to uniform doping of an impurity into layers epitaxially grown on the off substrate by tilting the orientation or the planar surface of the substrate from the axis "a" <11$\bar{2}$0>.

Other objects, features, and characteristics of the present invention will become apparent upon consideration of the following description and the appended claims with reference to the accompanying drawings, all of which form a part of the specification, and wherein referenced numerals designate corresponding parts in the various figures.

DETAILED DESCRIPTION OF THE PREFERRED EMBODIMENT

The invention will be more fully understood by reference to the following examples,

EXAMPLE 1

Figure 1:
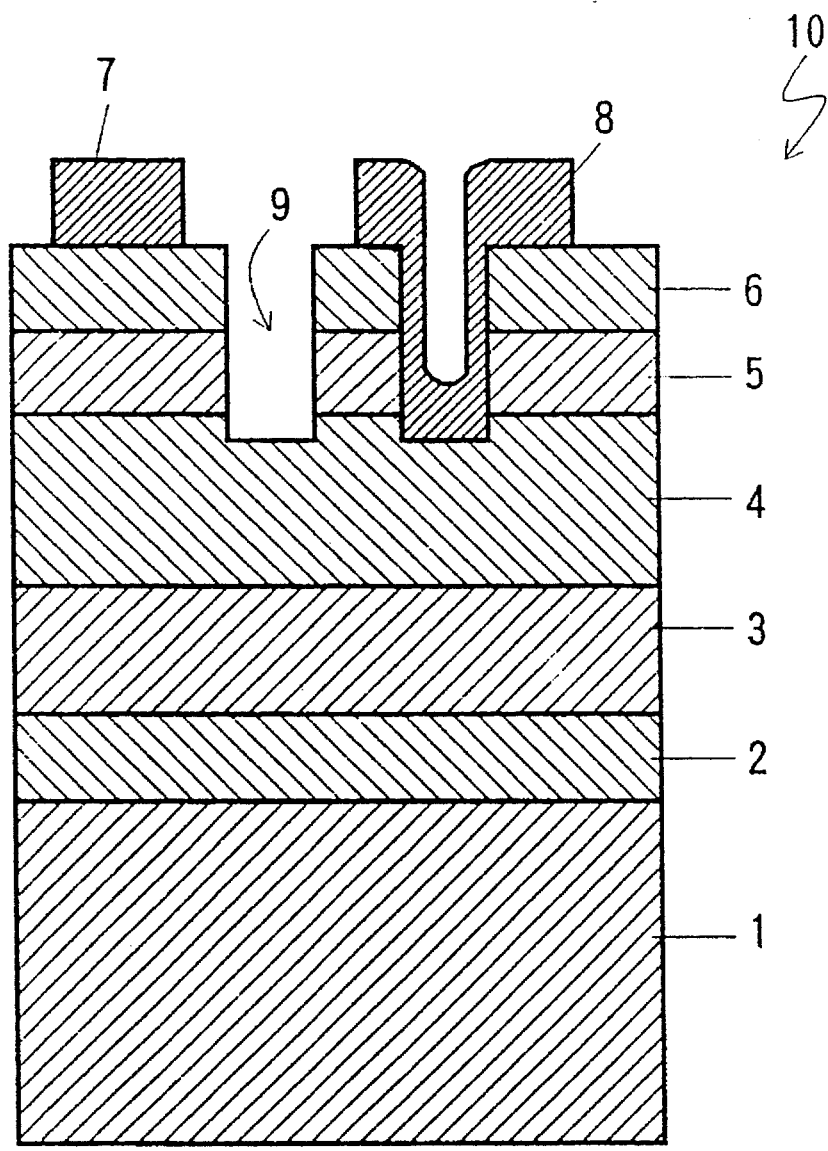
FIG. 1 is a diagram exhibiting the structure of the LED embodied in Example 1.

FIG. 1 shows an LED 10 embodied in Example 1. It has a sapphire ($Al_2O_3$) substrate 1 upon which an aluminum nitride (AlN) buffer layer 2 of 500 Å thickness is formed. The sapphire substrate is an off substrate with its plane of orientation tilted by 2 degrees from the axis "a" <11$\bar{2}$0>. The following five layers are consecutively formed on the AlN buffer layer 2: a silicon (Si) doped GaN $n^+$-layer 3 of high carrier (n-type) concentration; a Si-doped $(Al_{x2}Ga_{1-x2})_{y2}In_{1-y2}N$ $n^+$-layer 4 of high carrier (n-type) concentration; a zinc (Zn) and magnesium (Mg) doped $(Al_{x1}Ga_{1-x1})_{y1}In_{1-y1}N$ emission layer 5; and a Mg-doped $(Al_{x2}Ga_{1-x2})_{y2}In_{1-y2}N$ p-layer 6. The GaN $n^+$-layer 3 is about 2.0 μm in thickness and has a 2× $10^{18}/cm^3$ electron concentration. The $n^+$-layer 4 is about 2.0 μm in thickness and has $2\times10^{18}/cm^3$ electron concentration. The emission layer 5 is about 0.5 μm in thickness. The p-layer 6 is about 0.5 μm in thickness and has a $2\times10^{17}/cm^3$ hole concentration. Nickel electrodes 7 and 8 are connected to the p-layer 6 and the $n^+$-layer 4, respectively. They are electrically insulated by a groove 9.

The LED 10 is produced by gaseous phase growth, called metal organic vapor phase epitaxy referred to as MOVPE hereinafter.

The gases employed in this process are ammonia ($NH_3$), a carrier gas ($H_2$ or $N_2$), trimethyl gallium ($Ga(CH_3)_3$) (TMG hereinafter), trimethyl aluminum (Al $(CH_3)_3$) (TMA hereinafter), trimethyl indium ($In(CH_3)_3$) (TMI hereinafter), diethylzinc (($C_2H_5)_2Zn$) (DEZ hereinafter), silane ($SiH_4$), and biscyclopentadienyl magnesium ($Mg(C_5H_5)_2$) ($CP_2Mg$ hereinafter).

The sapphire substrate 1 which is single crystalline, whose main surface was tilted by 2 degrees from the axis "a" <11$\bar{2}$0> and was cleaned by an organic washing solvent and heat treatment, was placed on a susceptor in a reaction chamber for the MOVPE treatment. Then the sapphire substrate 1 was etched at 1100° C. by a vapor of $H_2$ fed into the chamber at a flow rate of 2 liter/min. under normal pressure for a period of 5 min.

A 500 Å thick AlN buffer layer 2 was epitaxially formed on the sapphire substrate 1 under conditions of lowering the temperature of the substrate 1 to 400° C., keeping the temperature constant, and supplying $H_2$, $NH_3$ and TMA for a period of about 90 sec. at a flow rate of 20 liter/min., 10 liter/min., and $1.8\times10^{-5}$ mol/min., respectively. On the buffer layer 2, about a 2.2 μm thick Si-doped GaN $n^+$-layer 3 of high carrier concentration with an electron concentration of about $2\times10^{18}/cm^3$ was formed under conditions of keeping the temperature of the sapphire substrate 1 at 1150° C. and supplying $H_2$, $NH_3$, TMG, and diluted silane to 0.86 ppm by $H_2$ for 30 min. at a flow rate of 20 liter/min., 10 liter/min., $1.7\times10^{-4}$ mol/min. and 200 ml/min., respectively.

The following manufacturing process provides for an emission layer 5 as an active layer, and an $n^+$-layer 4 of high carrier concentration and a p-layer 6 as clad layers; the LED 10 is designed to emit at a 500 nm wavelength peak in the luminous spectrum and have luminous centers of Zn.

On the $n^+$-layer 3, about a 0.5 μm thick Si-doped $(Al_{0.3}Ga_{0.7})_{0.94}In_{0.06}N$ $n^+$-layer 4 of high carrier concentration with an electron concentration of $1\times10^{19}/cm^3$ was formed under conditions of keeping the temperature of the sapphire substrate 1° at 800° C. and supplying $H_2$ or $N_2$, $NH_3$, TMG, TMA, TMI, and diluted silane to 0.86 ppm by $H_2$ for 60 min. at a flow rate of 20 liter/min., 10 liter/min., $1.12\times10^{-4}$ mol/min., $0.47\times10^{-4}$ mol/min., $0.1\times10^{-4}$ mol/min. and $10\times10^{-9}$ mol/min., respectively.

On the $n^+$-layer 4, about a 0.5 μm thick Mg- and Zn-doped $(Al_{0.09}Ga_{0.91})_{0.99}In_{0.01}N$ emission layer 5 was formed under conditions of keeping the temperature of the sapphire substrate 1° at 1150° C. and supplying $H_2$ or $N_2$, $NH_3$, TMG, TMA, TMI, $CP_2Mg$, and DEZ for 7 min. at a flow rate of 20 liter/min., 10 liter/min., $1.53\times10^{-4}$ mol/min., $0.47\times10^{-4}$ mol/min., $0.02\times10^{-4}$ mol/min., $2\times10^{-7}$ mol/min. and $2\times10^{-4}$ mol/min., respectively. At this stage, the emission layer 5 exhibited high resistivity of $10^{\Omega}$·cm or more. The impurity concentrations of Mg and Zn doped to the emission layer 5 were $2\times10^{18}/cm^3$ and $2\times10^{18}/cm^3$ respectively On the emission layer 5, about a 0.5 μm thick Mg-doped $(Al_{0.3}Ga_{0.7})_{0.94}In_{0.06}N$ p-layer 6 was formed under conditions of keeping the temperature of the sapphire substrate 1° at 1100° C. and supplying $N_2$ or $H_2$, $NH_3$, TMG, TMA, TMI, and $CP_2Mg$ for 120 min. at a flow rate of 20 liter/min., 10 liter/min., $1.12\times10^{-4}$ mol/min., $0.47\times10^{-4}$ mol/min., $0.1\times10^{-4}$ mol/min. and $2\times10^{-4}$ mol/min., respectively. Resistivity of the p-layer 6 was $10^8$ Ω·cm or more exhibiting insulative characteristics. The impurity concentration of Mg doped into the p-layer 6 was $1\times10^{20}/cm^3$.

Figure 2:
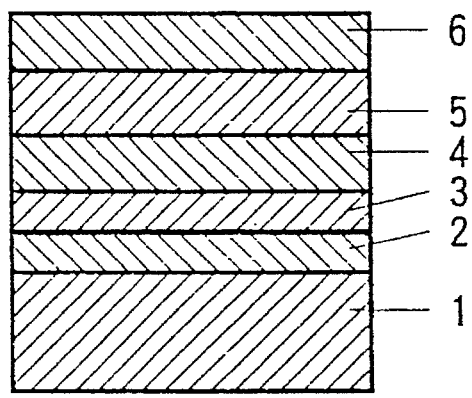
FIGS. 2 through 7 are sectional views illustrating successive steps of producing the LED embodied in Example 1.

Then, electron rays were uniformly irradiated into the emission layer 5 and the p-layer 6 using a reflective electron beam diffraction device. The irradiation conditions were set at 10 KV for the accelerating voltage, 1 μA for the sample current, 0.2 mm/sec. for the speed of the beam scanning, 60 μm for the beam aperture, and $5.0\times10^{-5}$ Torr vacuum. This irradiation changed the insulative emission layer 5 and p-layer 6 into a p-type conductive semiconductor with a hole concentration of $2\times10^{17}/cm^3$ and a resistivity of 2 Ω·cm. Thereby, a wafer with multi-structural layers was obtained as shown in FIG. 2.

The following FIGS. 3 to 7 show sectional views of an individual element on the wafer. In actual practice and in accordance with industry custom, a wafer with a large number of elements thereon is treated by the following process, and then, divided or diced into individual elements.

Figure 3:
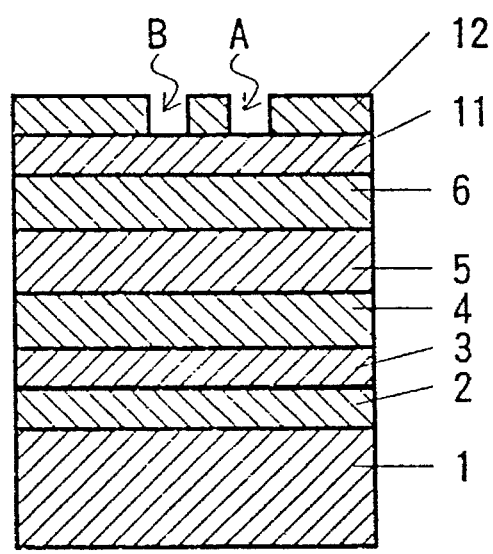
Figure 5:
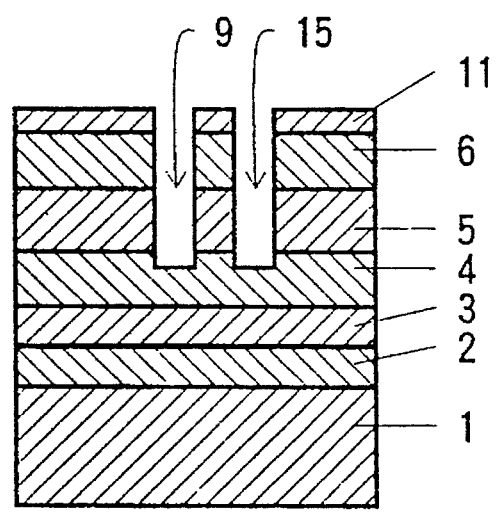

A 2000 Å thick $SiO_2$ layer 11 was formed on the p-layer 6 by sputtering. Then, the layer 11 was coated with a photoresist layer 12. Two selected parts or areas of the photoresist layer 12, named A and B, were removed by photolithography as shown in FIG. 3. The part or area A is an electrode forming part which corresponds to a place where a hole 15, shown in FIG. 5, is formed extending to and into the $n^+$-layer 4 of high carrier concentration. The part or area B corresponds to a place where a groove 9 shown in FIGS. 5 and 6 is formed for insulating or electrically insulating the part or area A from an electrode in contact with the p-layer 6.

Figure 4:
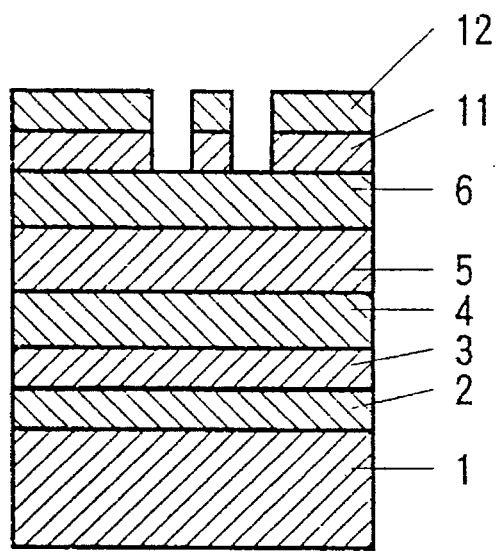

As shown in FIG. 4, two parts of the $SiO_2$ layer 11 which were not covered with the photoresist layer 12 were etched off by an etching liquid such as hydrofluoric acid. Then, the exposed part of the following successive three layers from the surface of the device, the p-layer 6, the emission layer 5, and the upper part of the $n^+$-layer 4 of high carrier concentration, were removed by dry etching, or supplying a high-frequency power density of 0.44 W/cm² and $BCl_3$ gas of 10 ml/min. at a vacuum degree of 0.04 Torr as shown in FIG. 5. After that, dry etching with argon (Ar) was carried out on the device. Consequently, a hole 15 for forming an electrode reaching the $n^+$-layer 4 of high carrier concentration and a groove 9 for insulation were formed.

Figure 6:
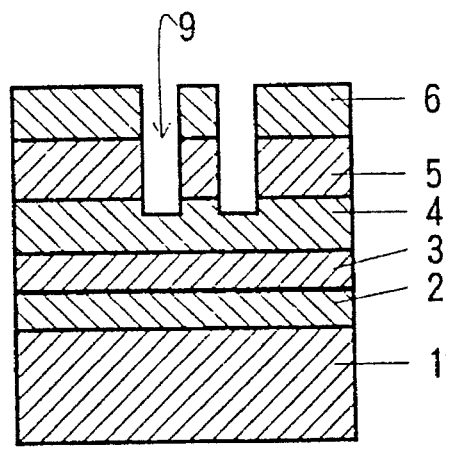
Figure 7:
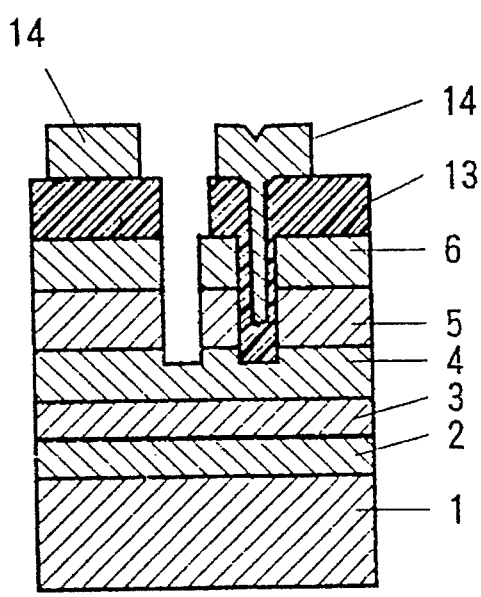

The $SiO_2$ layer 11 remaining on the p-layer 6 was removed by hydrofluoric acid as shown in FIG. 6. A nickel (Ni) layer 13 was laminated on the entire surface of the device by vapor deposition. Thus, the so-formed Ni layer 13 in the hole 15 is in electrical contact with the $n^+$-layer 4 of high carrier concentration. A photoresist 14 was deposited on the Ni layer 13 and, then, was selectively etched off by photolithography as shown in FIG. 7 leaving patterns of configuration for electrodes connected to the $n^+$-layer 4 of high carrier concentration and the p-layer 6, respectively.

Using the photoresist 14 as a mask, the exposed part or area of the Ni layer 13 from the photoresist 14 was etched off by an etching liquid such as nitric acid. At this time, the nickel layer 13 laminated in the groove 9 was also removed completely. Then, the photoresist layer 14 was removed by a photoresist removal liquid such as acetone. There were formed two electrodes, the electrode 8 for the $n^+$-layer 4 of high carrier concentration and the electrode 7 for the p-layer 6. A wafer treated with the above-mentioned process was divided or diced into each element which exhibits a gallium nitride light-emitting diode with a p-n junction structure as shown in FIG. 1.

Figure 8:
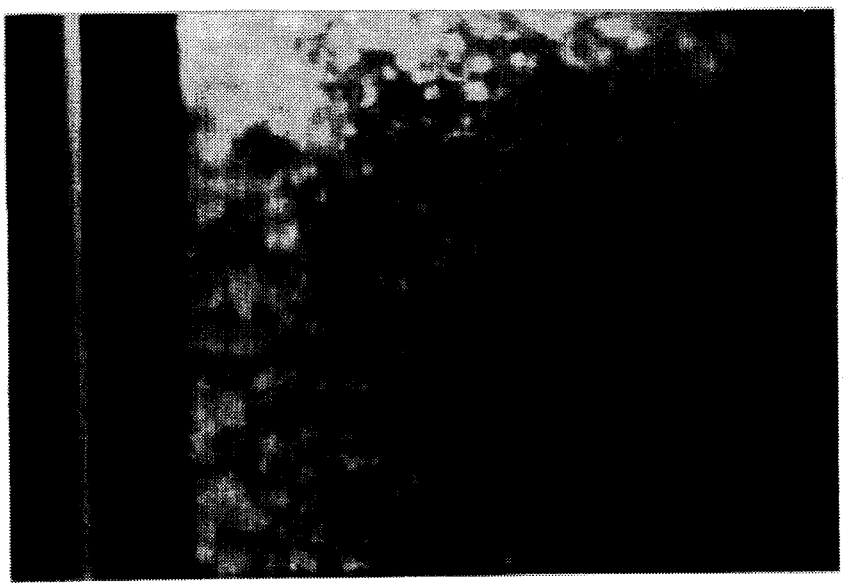
FIG. 8 is a photomicrograph exhibiting the luminous condition of a conventional light-emitting diode with a just substrate of sapphire.
Figure 9:
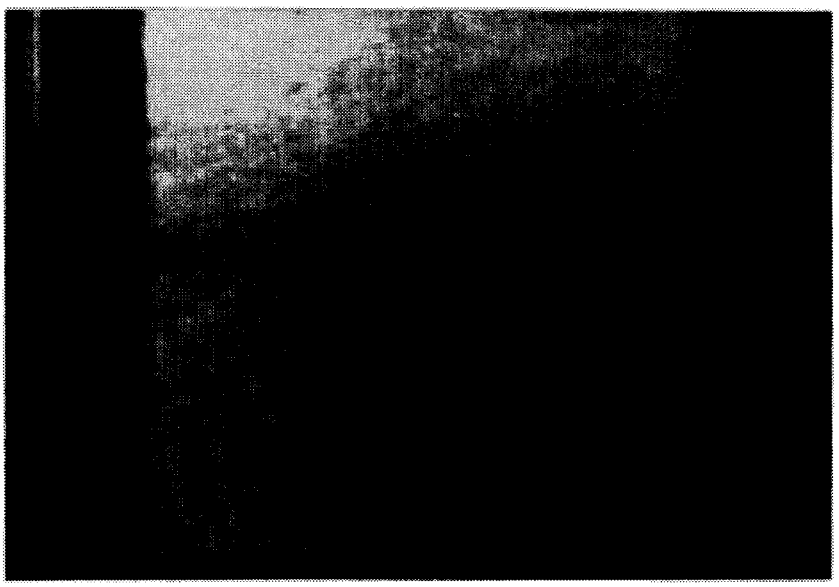
FIG. 9 is a photomicrograph exhibiting the luminous condition of the light-emitting diode with an off substrate of sapphire in accordance with Example 1.

The obtained LED 10 was found to have a luminous intensity of 200 mcd and a wavelength of 500 nm by driving current of 20 mA. The luminous condition of the LED 10 becomes a plane as shown in FIG. 9. FIG. 8 exhibits a luminous condition of an LED with a just substrate of sapphire for comparison. The luminous condition of FIG. 8 is a group of dots. The luminous intensity of the LED 10 with the off substrate is 1.5 to 1.8 folds of the LED with the just substrate.

Figure 10:
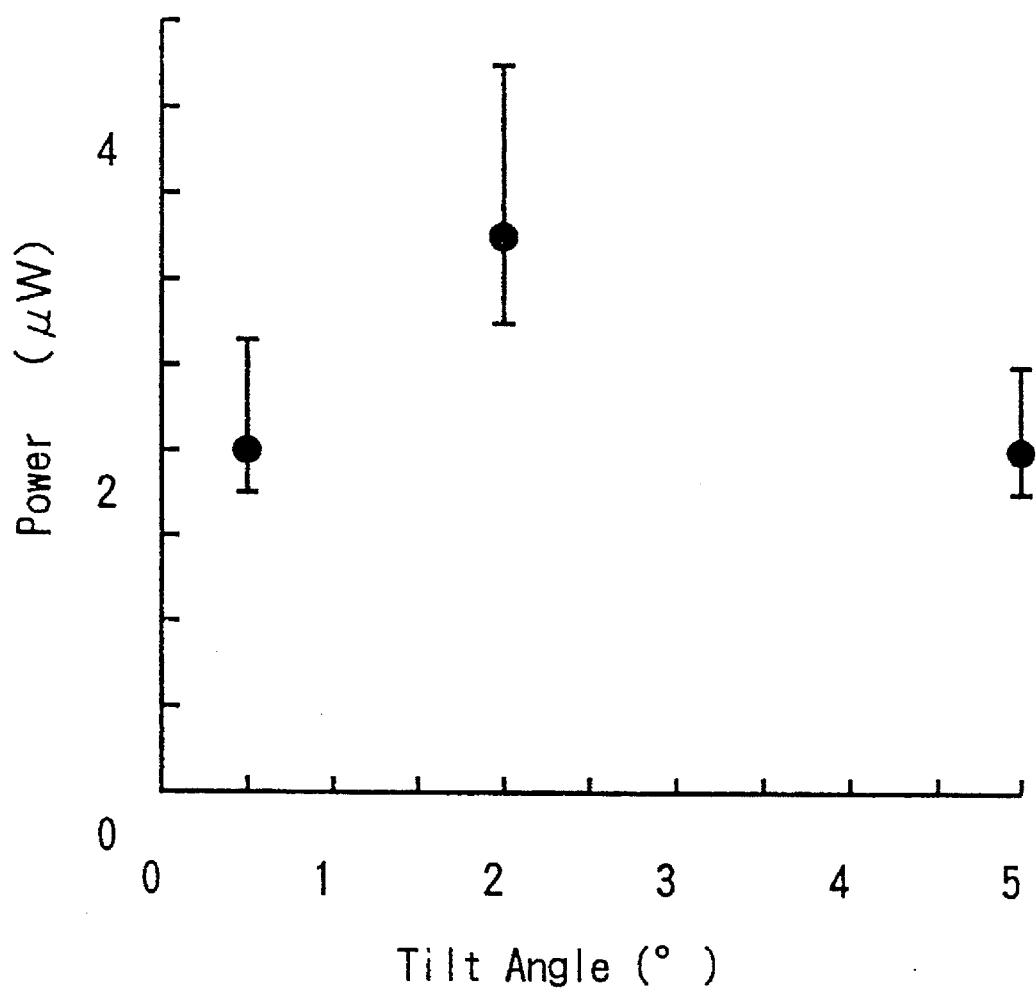
FIG. 10 is a view exhibiting the relation between the tilt angle of sapphire substrates and the luminous intensity of light-emitting diodes.

Various luminous intensities of the LED with an off substrate from the axis "a" are measured respectively setting the tilt angle to 0.5, 2, and 5 degrees. The result shown in FIG. 10 tells that the most desirable tilt angle to improve luminous intensity is from 1 to 4 degrees from the axis "a" $<11\bar{2}0>$.

The emission layer 5 preferably contains impurity concentrations of Mg and Zn within a range of $1\times10^{17}/cm^3$ to $1\times10^{20}/cm^3$ respectively, in order to improve luminous intensity.

While the invention has been described in connection with what are presently considered to be the most practical and preferred embodiments using the LED satisfying the formula of $Al_xGa_yIn_{1-x-y}N$, inclusive of x=0, y=0, and x=y=0, the invention is not to be limited to the disclosed embodiments, but on the contrary, is intended to cover various modifications and equivalent arrangements such as laser diodes and manufacturing method of thin films with the formula of $Al_xGa_yIn_{1-x-y}N$, inclusive of x=0, y=0, and x=y=0 within the spirit and scope of the appended claims.

What is claimed is:

1. A light-emitting semiconductor device comprising:

a sapphire substrate;

an n-layer with n-type conduction of group III nitride compound semiconductor satisfying the formula $Al_xGa_yIn_{1-x-y}N$, $0 \leq x \leq 1$ $0 \leq x \leq 1$, and $0 \leq x+y \leq 1$;

a magnesium (Mg) doped p-layer with p-type conduction of group III nitride compound semiconductor satisfying the formula $Al_xGa_yIn_{1-x-y}N$, $0 \leq x \leq 1$, $0 \leq y \leq 1$, and $0 \leq x+y \leq 1$; and wherein a plane orientation of said sapphire substrate is set at an off angle within the range of 1 to 4 degrees from an axis "a" $<11\bar{2}0>$ of said sapphire substrate.

* * * * *